(12) United States Patent
Han et al.

(10) Patent No.: US 9,377,916 B2
(45) Date of Patent: Jun. 28, 2016

(54) TOUCH PANEL

(71) Applicant: LG INNOTEK CO., LTD., Seoul (KR)

(72) Inventors: Jae Heung Han, Seoul (KR); Jong Il Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/447,126

(22) Filed: Jul. 30, 2014

(65) Prior Publication Data

US 2015/0107978 A1    Apr. 23, 2015

(30) Foreign Application Priority Data

Oct. 18, 2013    (KR) .......................... 10-2013-0124876

(51) Int. Cl.
| | |
|---|---|
| *H01H 13/70* | (2006.01) |
| *H01H 25/00* | (2006.01) |
| *H01H 25/04* | (2006.01) |
| *G06F 3/044* | (2006.01) |
| *G06F 3/041* | (2006.01) |

(52) U.S. Cl.
CPC .............. *G06F 3/044* (2013.01); *G06F 3/041* (2013.01); *G06F 2203/04111* (2013.01); *H03K 2217/96075* (2013.01); *H03K 2217/960755* (2013.01)

(58) Field of Classification Search
CPC ....... H01H 13/70; H01H 25/00; H01H 25/04; H01H 1/00; H01H 13/702–13/704; H01H 2239/074; H01H 2203/008; H01H 2207/01; H01H 2221/00; H01H 2231/002; H01H 2231/012; H01H 2231/016; H01H 2231/052; H01H 2239/006

USPC ..... 200/5 R, 600, 46, 5 A, 292, 243; 345/173
See application file for complete search history.

(56) References Cited

U.S. PATENT DOCUMENTS

| | | | | |
|---|---|---|---|---|
| 7,864,503 | B2 * | 1/2011 | Chang ..................... | G06F 3/044 200/269 |
| 2008/0142352 | A1 * | 6/2008 | Wright ..................... | G06F 3/044 200/600 |
| 2011/0304578 | A1 * | 12/2011 | Kim ......................... | G06F 3/044 345/174 |

FOREIGN PATENT DOCUMENTS

| | | |
|---|---|---|
| KR | 10-2011-0065260 A | 6/2011 |
| KR | 10-2011-0134683 A | 12/2011 |

* cited by examiner

*Primary Examiner* — Renee Iuebke
*Assistant Examiner* — Anthony R. Jimenez
(74) *Attorney, Agent, or Firm* — Saliwanchik, Lloyd & Eisenschenk

(57) ABSTRACT

A touch panel includes a cover substrate; a first sensing electrode including first unit sensing electrodes spaced apart from each other in a first direction on the cover substrate and first connecting electrodes to connect the first unit sensing electrodes to each other; a second sensing electrode including second unit sensing electrodes spaced apart from each other in a second direction on the cover substrate; and a bridge electrode insulated from the first unit sensing electrodes to connect the second unit sensing electrodes to each other, wherein the bridge electrode includes connecting bridge electrodes to connect the second unit sensing electrodes to each other and second unit bridge electrodes overlapping with the second unit sensing electrodes.

14 Claims, 11 Drawing Sheets

TOUCH PANEL

CROSS-REFERENCES TO RELATED APPLICATION

This application claims the benefit under 35 U.S.C. §119 of Korean Patent Application No. 10-2013-0124876, filed Oct. 18, 2013, which is hereby incorporated by reference in its entirety.

BACKGROUND

Technical Field

The disclosure relates to a touch panel.

Recently, a touch panel, which performs an input function through the touch of an image displayed on a display device by an input device, such as a stylus pen or a finger, has been applied to various electronic appliances.

Such a touch panel may be mainly classified into a resistive touch panel and a capacitive touch panel. In the resistive touch panel, glass is shorted with an electrode due to the pressure of the input device so that a touch point is detected. In the capacitive touch panel, the position of the touch point is detected by detecting the variation in capacitance between electrodes when a finger of the user is touched on the capacitive touch panel.

In the resistive type touch panel, the repeated use thereof may degrade the performance thereof, and cause scratches. Accordingly, the interest on the capacitive type touch panel representing superior endurance and having a long lifespan is increased.

The touch panel may be provided in various types according to a position at which a sensing electrode is formed. For example, the sensing electrode may be directly formed on a cover substrate.

In this case, the sensing electrode may include first and second sensing electrodes. At least one of the first and second sensing electrodes may be electrically connected through a bridge electrode.

However, the first and second sensing electrodes are connected to each other in a serial structure, so that the resistance of the sensing electrode is increased.

Thus, a touch panel having a new structure and capable of reducing the resistance of the sensing electrode is requested.

BRIEF SUMMARY

The embodiment provides a touch panel having improved reliability.

According to the embodiment, there is provided a touch panel including a cover substrate; a first sensing electrode including first unit sensing electrodes spaced apart from each other in a first direction on the cover substrate and first connecting electrodes to connect the first unit sensing electrodes to each other; a second sensing electrode including second unit sensing electrodes spaced apart from each other in a second direction on the cover substrate; and a bridge electrode insulated from the first unit sensing electrodes to connect the second unit sensing electrodes to each other, wherein the bridge electrode includes connecting bridge electrodes to connect the second unit sensing electrodes to each other and second unit bridge electrodes overlapping with the second unit sensing electrodes.

The touch panel according to the embodiment includes the sensing electrode provided on one surface of the cover substrate and the bridge electrode provided on one surface of the insulating layer in which the though-hole is formed.

In this case, the bridge electrode may be provided in the same pattern as that of the sensing electrode disposed on one surface of the cover substrate.

Thus, the sensing electrode disposed on one surface of the cover substrate is connected to the sensing electrode disposed on one surface of the insulating layer in a parallel structure by the though-hole, so that the resistance of the sensing electrode disposed on the cover substrate can be reduced.

Therefore, according to the touch panel of the embodiment, since the electrical resistance of the sensing electrode is reduced, the efficiency of the touch panel can be improved.

DETAILED DESCRIPTION

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Referring to FIGS. 1 to 8, a touch panel 10 according to the embodiment includes a cover substrate 100, a sensing electrode 200 disposed on the cover substrate, an insulating layer 300 disposed on the sensing electrode 200, a bridge electrode disposed on the insulating layer 300, and wire electrodes 500 connected to the sensing electrodes 200.

Figure 1:
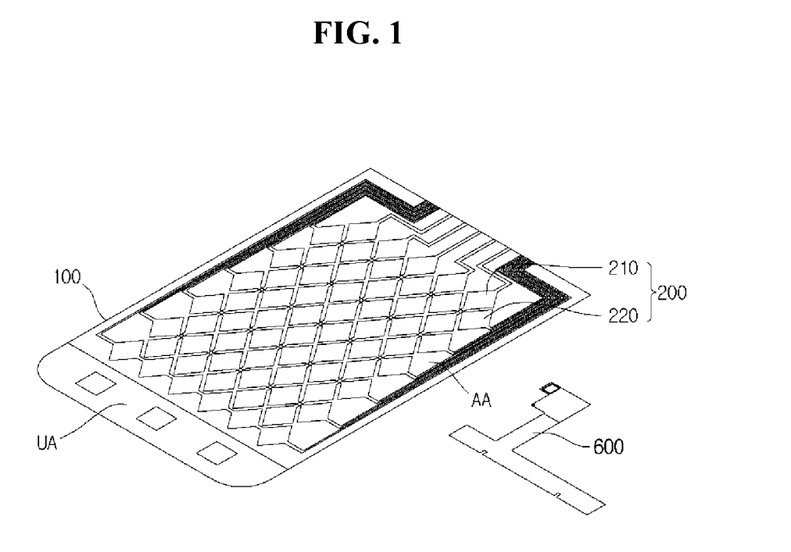
FIG. 1 is a perspective view showing a touch panel according to the first and second embodiments.
Figure 2:
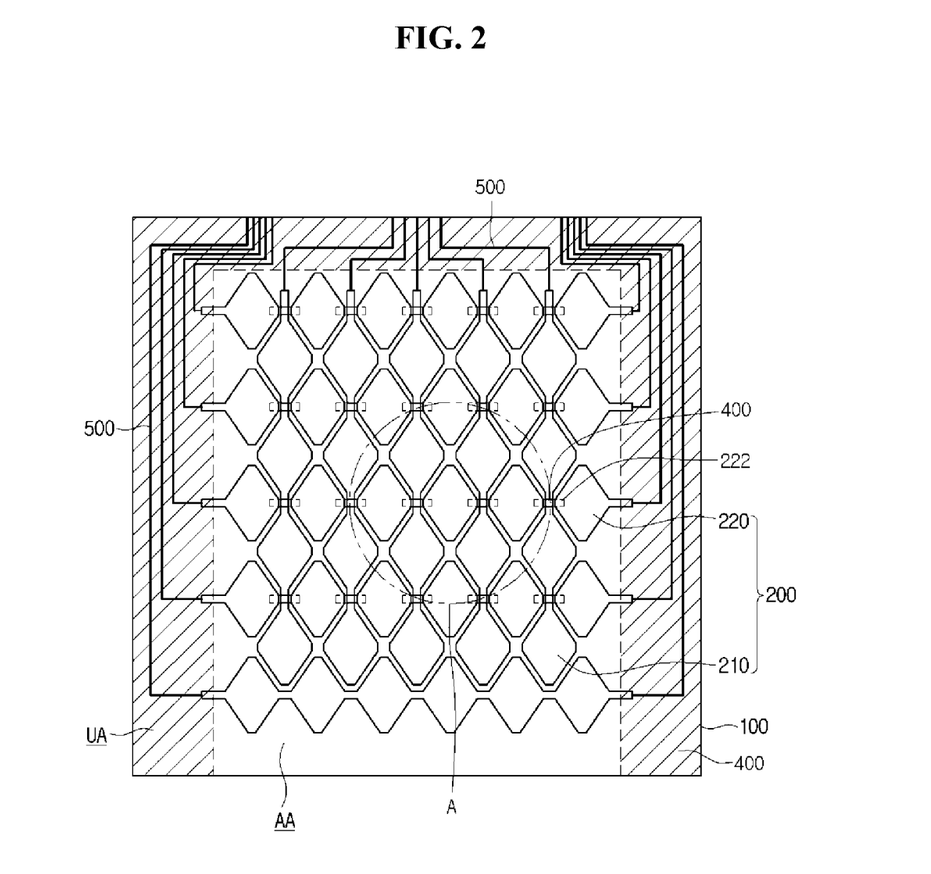
FIG. 2 is a plan view showing a touch panel according to the first embodiment.

The cover substrate 100 may include glass or plastic. For example, the cover substrate 100 may include strengthened glass, half-strengthened glass, sodalime glass, strengthened plastic, or flexible plastic.

The cover substrate 100 may include an active area AA and an inactive area UA. The active area AA signifies an area through which a touch instruction of a user may be input. In addition, the inactive area UA has the concept opposite to that of the active area AA, that is, the inactive area UA is not activated even if a user touches the inactive area UA, so the inactive area UA signifies an area through which any touch instructions cannot be input.

For example, the sensing electrode 200 may be disposed in the active area AA and the wire electrode 500 may be disposed in the inactive area UA.

The sensing electrode 200 may be disposed on the cover substrate 100. In detail, the sensing electrode 200 may be disposed in the active area AA on the cover substrate 100.

The sensing electrode 200 may include first and second electrodes 210 and 220.

The first sensing electrode 210 may extend in the first direction on the active area AA of the cover substrate 100. In detail, the first sensing electrode 210 may be disposed on one surface of the cover substrate 100.

The first sensing electrode 210 may include first unit sensing electrodes 211 disposed on one surface of the cover substrate 100 and spaced apart from each other in a first direction, and first connecting electrodes 212 for connecting the first unit sensing electrodes 211 to each other. The first unit sensing electrodes 211 and the first connecting electrodes 212 may be directly disposed on one surface of the cover substrate 100.

The second sensing electrode 220 may extend in the second direction on the active area AA of the cover substrate 100. In detail, the second sensing electrode 220 may be disposed on one surface of the cover substrate 100 while extending in a direction different from the direction of the first sensing electrode 210. The second sensing electrode 220 may include second unit sensing electrodes 211 disposed on one surface of the cover substrate 100 and spaced apart from each other in a first direction, and a bridge electrode for connecting the second unit sensing electrodes 221 to each other. The second unit sensing electrodes 221 may be directly disposed on one surface of the cover substrate 100. In addition, the bridge electrode may be disposed on at least one of the upper surfaces of the first connecting electrode 212, the first unit sensing electrode 211 and the second unit sensing electrode 221 such that the bridge electrode makes direct contact with the second unit sensing electrode 221.

For example, the first and second unit sensing electrodes 211 and 221 may extend while crossing each other. That is, the first and second unit sensing electrodes 211 and 221 may be provided on the top surface of the cover substrate 100, that is, the same surface of the cover substrate 100.

The first and second unit sensing electrodes 211 and 221 are depicted in a rhombus shape in the drawings but, the embodiment is not limited thereto. The first and second sensing electrodes 210 and 220 may be formed in various shapes such as a polygonal shape including a triangular shape and a rectangular shape, a circular shape, a linear shape, an H-shape or an elliptical shape.

The insulating layer 300 may be disposed on the sensing electrode 200.

Figure 3:
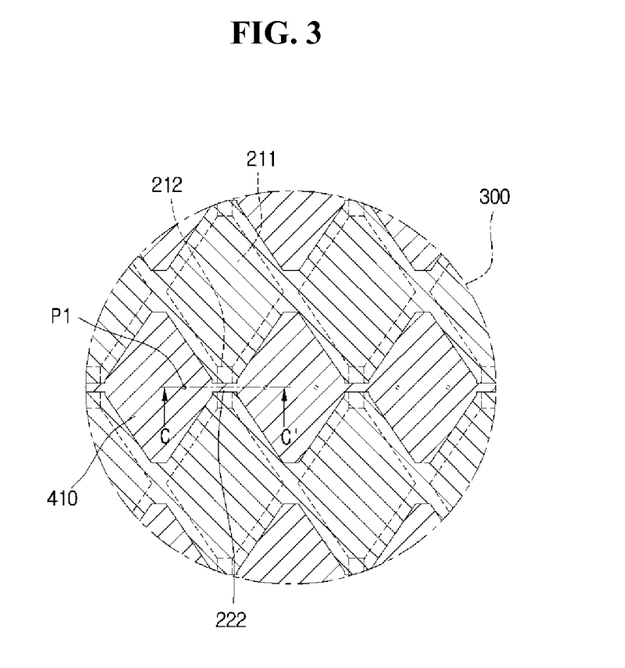
FIG. 3 is an enlarged view showing port A in FIG. 2.

In detail, referring to FIG. 3, the insulating layer 300 may be disposed on the first and second sensing electrodes 210 and 220. The insulating layer 300 may surround the first and second sensing electrodes 210 and 220. For example, the insulating layer 300 may cover all of the first and second sensing electrodes 210 and 220.

Figure 4:
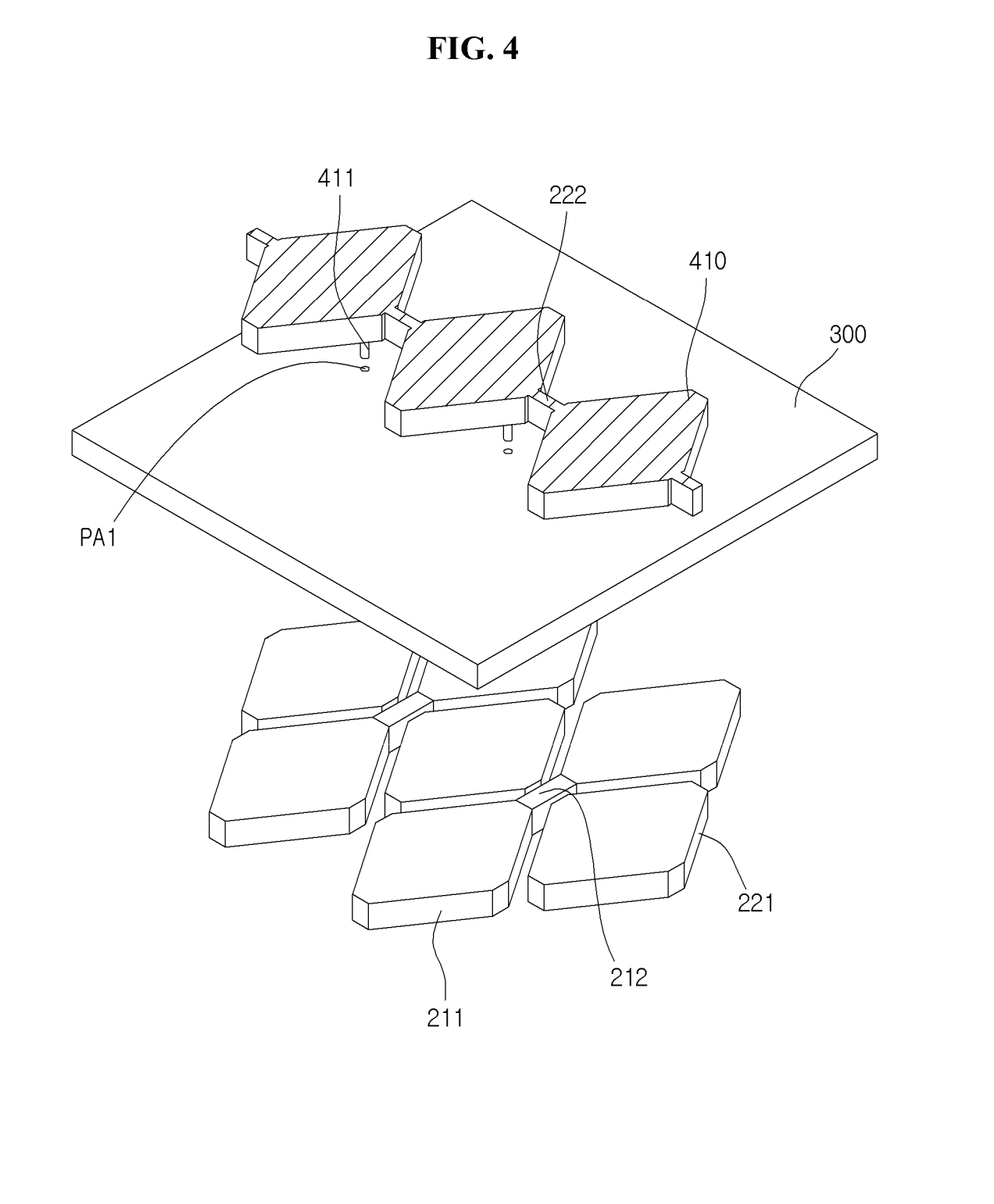
FIGS. 4 to 6 are enlarged perspective views of FIG. 3 according to the arrangement of an insulating layer.

Referring to FIG. 4, the insulating layer 300 may surround only the second sensing electrode 220. In detail, the insulating layer 300 may surround the second unit sensing electrodes 221 and the bridge electrode for connecting the second unit sensing electrodes 221 to each other. In more detail, the insulating layer 300 may have the same shape as those of the second unit sensing electrode 221 and the bridge electrode and may be disposed on the second sensing electrode 220. That is, the insulating layer 300 may entirely overlap with the second sensing electrode 220.

Figure 5:
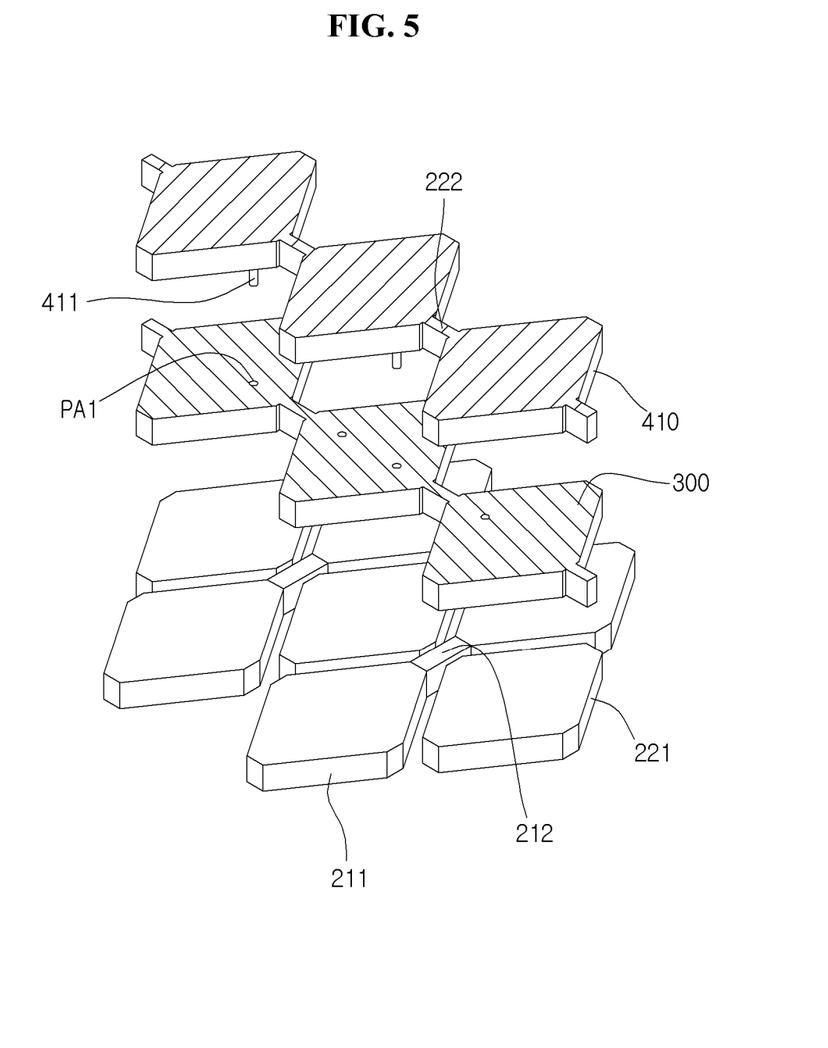
Figure 6:
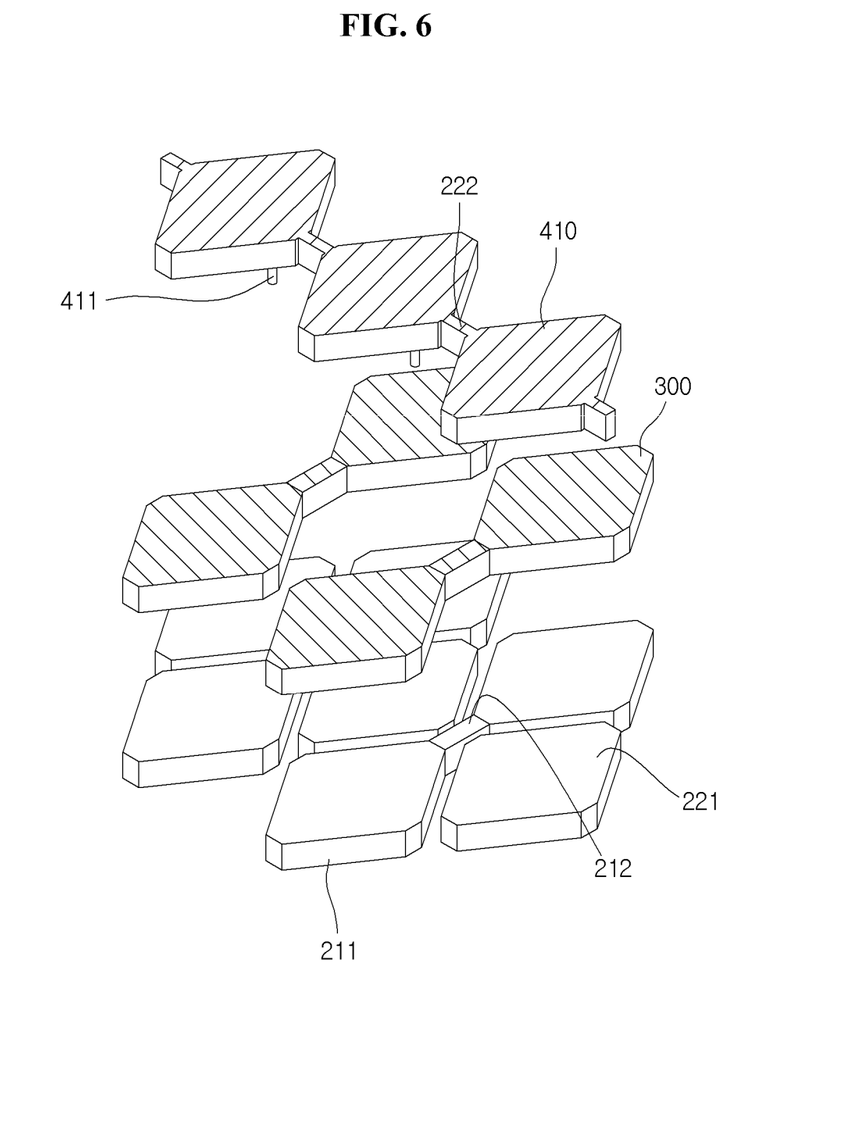

Referring to FIG. 5, the insulating layer 300 may surround only the first sensing electrode 210. In detail, the insulating layer 300 may surround the first connecting electrode 212 for connecting the first unit sensing electrodes 211 to each other. In more detail, the insulating layer 300 may have the same shape as those of the first unit sensing electrode 211 and the first connecting electrode 212 and disposed on the first sensing electrode 210. That is, the insulating layer 300 may entirely overlap with the first sensing electrode 210.

Referring to FIGS. 2 to 6, the bridge electrode may include a connecting bridge electrode 222 for connecting the second unit sensing electrodes 221 to each other, and a second unit bridge electrode 410 overlapping with the second unit sensing electrode 222. The connecting bridge electrode 222 and the second unit bridge electrode 410 may be integrally formed with each other.

The bridge electrode may make direct contact with the insulating layer 300. That is, the connecting bridge electrode 222 and the second unit bridge electrode 410 may make direct contact with the insulating layer 300.

The bridge electrode may connect the second unit sensing electrodes 221 to each other. In detail, the second unit sensing electrodes 221 may be connected to each other through at least one bridge electrode of the connecting bridge electrodes 222 and the second unit bridge electrodes 410.

In detail, the second unit sensing electrodes 221 may be connected to each other through the connecting bridge electrode 222 or the second unit bridge electrode 410. In more detail, first through-holes PA1 may be formed in the insulating layer surrounding the second unit sensing electrode 221. The second unit sensing electrode 221 and the connecting bridge electrode 222, or the second unit sensing electrode 221 and the second unit bridge electrode 410 may be electrically connected to each other through the first through-hole PA1. That is, a protrusion 411 of the second unit bridge electrode 410 may be electrically connected to the second unit sensing electrode 221 through the first through-hole PA1.

Thus, the connecting bridge electrode 222 or the second unit bridge electrode 410 may be provided on the insulating layer 300, and may electrically connect the second unit sensing electrodes 221 formed on one surface of the cover substrate 100 to each other.

Thus, the second unit sensing electrode 221 is connected to the connecting bridge electrode 222 and the second unit bridge electrode 410, which are disposed on the insulating layer 300, through the first through-hole PA1, so that two layers or more may be formed as a whole.

Figure 7:
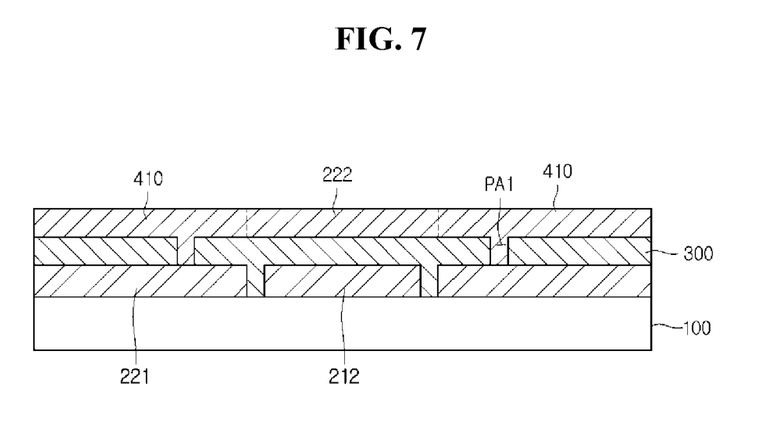
FIG. 7 is a sectional view taken along line C-C' of FIG. 3.
Figure 8:
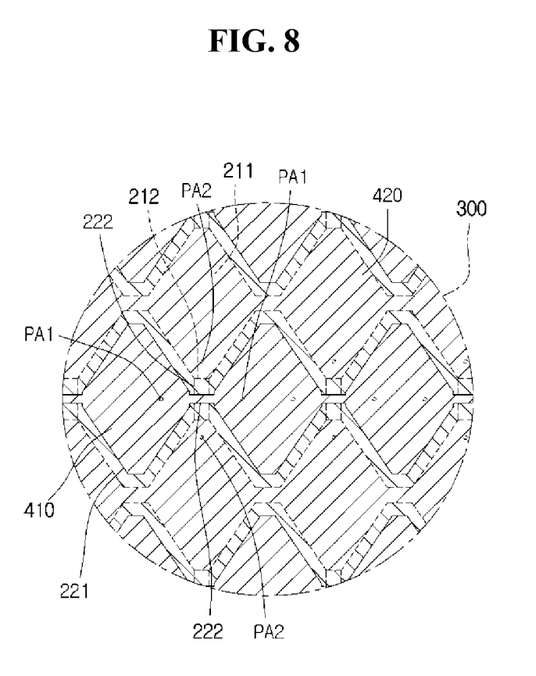
FIG. 8 is an enlarged view of portion A in FIG. 2.
Figure 9:
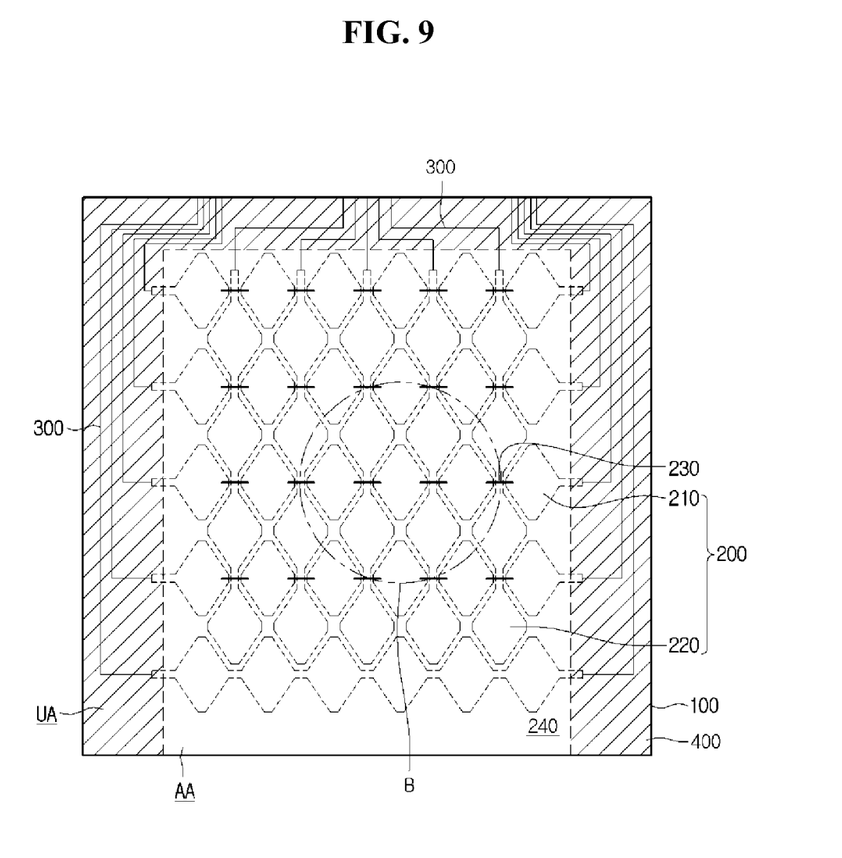
FIG. 9 is a plan view showing a touch panel according to the second embodiment.

Referring to FIG. 7, the bridge electrode may further include a first unit bridge electrode 420. In detail, the first unit bridge electrode 420 may be disposed at a position such that the first unit bridge electrode 420 overlaps with the first unit sensing electrode 211. The position of the first unit bridge electrode 420 disposed on the insulating layer 300 may entirely or partly overlap with the position of the first unit sensing electrode 211 disposed on one surface of the cover substrate 100.

The first unit bridge electrode 420 may be connected to the first unit sensing electrode 211. In detail, second through-holes PA2 may be formed in the insulating layer in which the first unit bridge electrode 420 and the first unit sensing electrode 211 overlap with each other. The first unit bridge electrode 420 may be electrically connected to the first unit sensing electrode 211 through the second through-hole PA2.

Thus, the first unit sensing electrode 211 is connected to the first unit bridge electrode 420 disposed on the insulating layer 300 through the second through-hole PA2, so that two layers or more may be formed as a whole The first unit sensing electrode 211, the first connecting electrode 212, the connecting bridge electrode 222, the second unit sensing electrode 221, the first unit bridge electrode 410 and the second unit bridge electrode 420 may include the same material. In detail, the first unit sensing electrode 211, the second unit sensing electrode 221, the connecting bridge electrode 222, the first connecting electrode 212, the first unit bridge electrode 410 and the second unit bridge electrode 420 may include a conductive material. The conductive material may include a transparent conductive material such as indium tin oxide (ITO).

In addition, the first and second unit bridge electrodes 410 and 222 may include a metallic material such as copper (Cu).

The wire electrode 500 may be electrically connected to the first and second sensing electrodes 210 and 220. In detail, the wire electrode 500 is provided in the inactive area UA on the cover substrate 100, such that the wire electrode 500 may be electrically connected to the first and sensing electrodes 210 and 220.

Although not shown in the drawings, a black or white printed layer 400 may be disposed in the inactive area UA such that the wire electrode is not seen in the inactive area UA. In this case, the wire electrode 500 may be provided on the printed layer 400.

The wire electrode 500 may include a conductive material. For example, the wire electrode 500 may include a metallic material such as copper (Cu) or silver (Ag). However, the embodiment is not limited thereto, but the wire electrode 500 may include a transparent conductive material such as indium tin oxide (ITO).

The wire electrode 500 may receive a sensed touch signal from the sensing electrode 200 and the touch signal may be transferred through the wire electrode 500 to a driving chip mounted on the printed circuit board 600 connected to the wire electrode 500.

The printed circuit board 600 may be disposed in the inactive area UA. The printed circuit board 600 may be a flexible printed circuit board (FPCB). The printed circuit board 600 may be connected to the wire electrode 500 disposed on the inactive area UA. In detail, the printed circuit board 600 may be electrically connected to the wire electrode 500 in the inactive area UA.

The driving chip may be mounted on the printed circuit board 600. In detail, the driving chip may receive the touch signal sensed by the sensing electrode 200 from the wire electrode 500 to perform an operation according to the touch signal.

The touch panel according to the embodiment includes unit bridge electrodes having the same pattern as those of the first and/or second sensing electrodes such that the unit bridge electrodes overlap with the first and/or second sensing electrodes.

Thus, the first and/or second sensing electrodes may consist of the sensing electrode formed on one surface of the cover substrate and the sensing electrode formed on one surface of the insulating layer, and the sensing electrodes may be electrically connected to each other through the through-holes formed in the insulating layer.

That is, the first and/or second sensing electrodes may be formed in two layers or more which may be connected to each other in a parallel structure. Thus, the first and/or second sensing electrodes are disposed in a parallel structure so that the electric resistances of the first and/or second electrodes may be reduced.

Therefore, the electric resistance of the touch panel according to the embodiment may be reduced so that the efficiency of the touch panel may be improved.

Hereinafter, a touch panel according to the second embodiment will be described with reference to FIGS. 1, and 9 to 11. In the following description about the touch panel according to the second embodiment, the descriptions about the parts similar or identical to those of the first embodiment will be omitted in order to avoid redundancy.

The touch panel according to the second embodiment may be different from the touch panel according to the first embodiment in terms of the stack sequence of the sensing electrodes, the bridge electrode and the insulating layer.

In detail, the touch panel according to the second embodiment may include a cover substrate 100, a bridge electrode provided on the cover substrate 100, a first sensing electrode provided on the bridge electrode and including first unit sensing electrodes spaced apart from each other in a first direction and first connecting electrodes for connecting the first unit sensing electrodes to each other, and a second sensing electrode provided on the bridge electrode and including second unit sensing electrodes spaced apart from each other in a second direction and second connecting electrodes for connecting the second unit sensing electrodes to each other.

That is, the sensing electrode, the insulating layer and the bridge electrode are stacked on one surface of the cover substrate in the order of the sensing electrode, the insulating layer and the bridge electrode in the touch panel of the first embodiment. However, according to the touch panel of the second embodiment, the bridge electrode, the insulating layer and the sensing electrode may be stacked on one surface of the cover substrate in the order of the bridge electrode, the insulating layer and the sensing electrode.

In detail, the bridge electrode may be directly formed on the cover substrate and at least a part of the first unit sensing electrodes, the second unit sensing electrodes and the first connecting electrode may be provided on the bridge electrode.

The bridge electrode may be directly provided on one surface of the cover substrate. In addition, the sensing electrode may be provided on the bridge electrode. In detail, the insulating layer may be provided on the bridge electrode and the sensing electrode may be provided on the insulating layer. The sensing electrode may include a first sensing electrode 210 and a second sensing electrode 220.

The first sensing electrode 210 may include first sensing electrodes 211 spaced apart from each other in a first direction and a first connecting electrode 212 for connecting the first unit sensing electrodes 211 to each other. In addition, the second sensing electrode 220 may include second unit sensing electrodes 221 spaced apart from each other in a second direction.

The bridge electrode may include connecting bridge electrodes 222 for connecting the second unit sensing electrodes to each other, and second unit bridge electrodes 410 overlapping with the second unit sensing electrodes.

Figure 10:
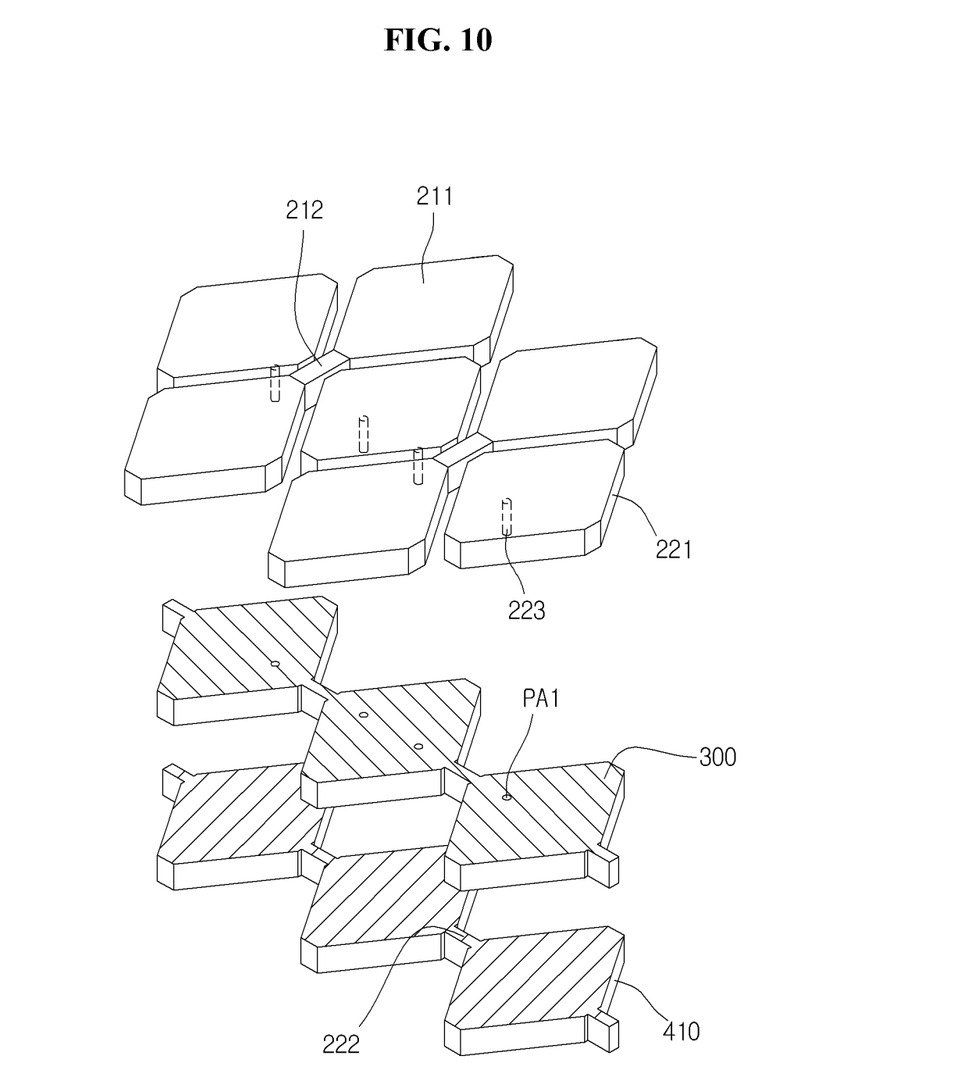
FIGS. 10 and 11 are enlarged perspective views of portion B in FIG. 9 according to the arrangement of an insulating layer.
Figure 11:
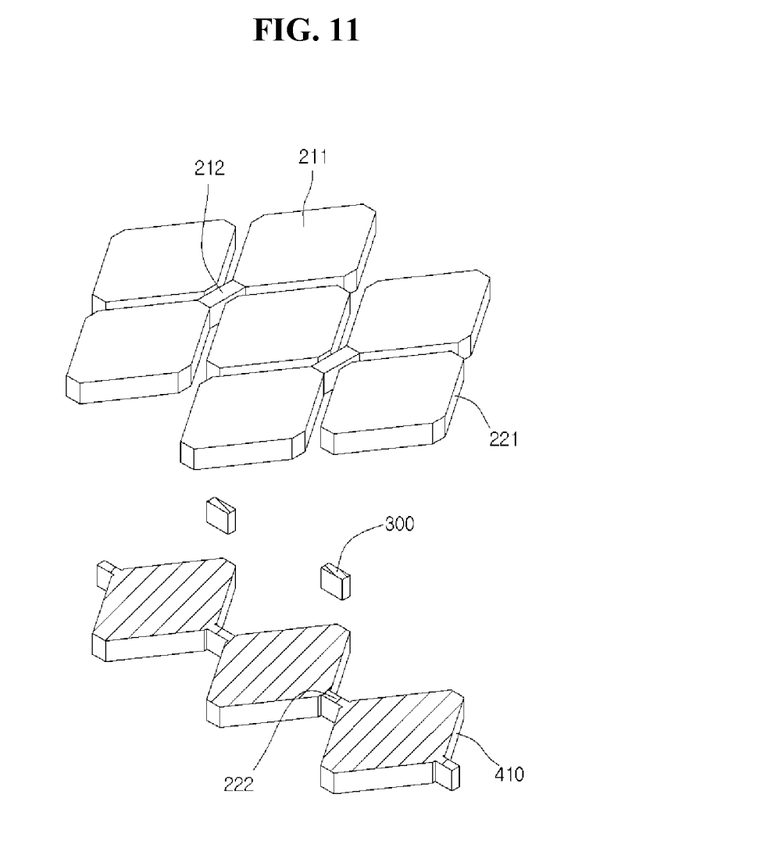

The insulating layer 300 may be provided on the bridge electrode. In detail, the insulating layer 300 may be partially provided on the bridge electrode. For example, as shown in FIG. 11, the insulating layer 300 may be provided on the connecting bridge electrode 222. In addition, as shown in FIG. 10, the insulating layer 300 may be provided on the connecting bridge electrode 222 and the second unit bridge electrode 410. That is, the insulating layer 300 may completely overlap with the bridge electrode.

In detail, the second unit sensing electrodes 221 may be electrically connected through the connecting bridge electrode 222 or the second unit bridge electrode 410 to each other. In more detail, the first through-holes PA1 are formed in the insulating layer surrounding the connecting bridge electrode 222 and the second unit bridge electrode 410, and the second unit sensing electrode 221 and the connecting bridge electrode 222, or the second unit sensing electrode 221 and the second unit bridge electrode 410 may be electrically connected to each other through the first through-hole PA1. That is, a protrusion 223 of the second unit sensing electrode 221 may be electrically connected to the second unit bridge electrode 221 through the first through-hole PA1.

Figure 12:
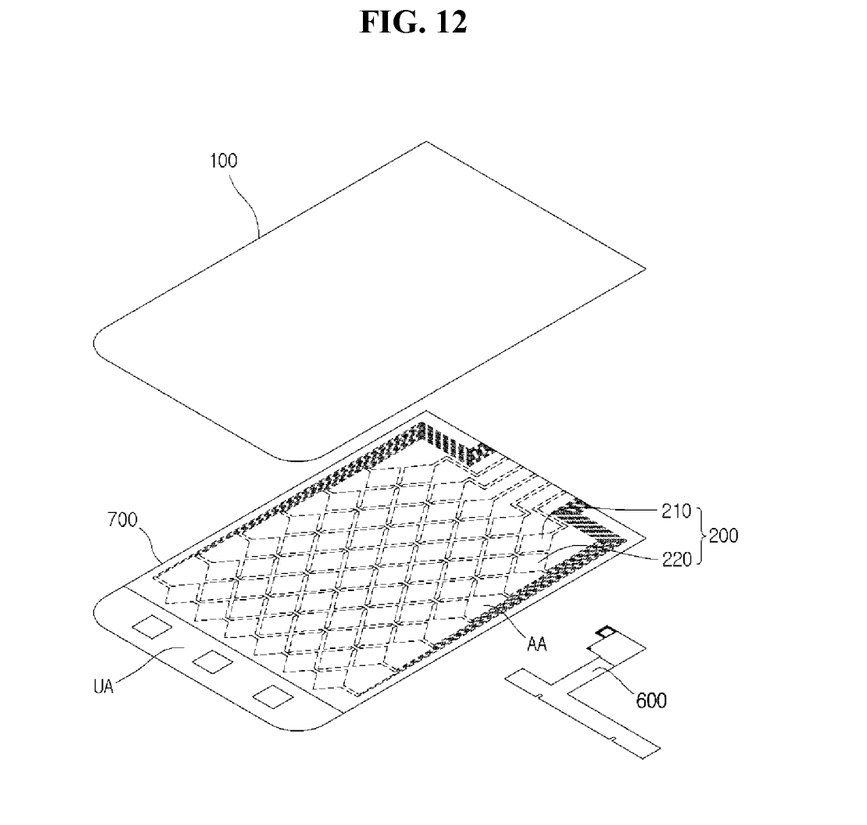
FIG. 12 is a perspective view showing a touch panel according to the third embodiment.

Hereinafter, a touch panel according to the third embodiment will be described with reference to FIG. 12. In the following description about the touch panel according to the third embodiment, the descriptions about the parts similar or identical to those of the first and second embodiments will be omitted in order to avoid redundancy.

The touch panel according to the third embodiment may include a substrate 700 provided on a cover substrate 100. In addition, a sensing electrode, an insulating layer, a bridge electrode and a wire electrode may be provided on the substrate 700.

That is, according to the touch panel of the third embodiment, the first and second sensing electrodes, the bridge electrode and the insulating layer may be disposed on the substrate disposed on the cover substrate, other than one surface of the cover substrate.

In detail, at least one among the first and second unit sensing electrodes, the first connecting electrode and the bridge electrode may be directly formed on the substrate.

Similarly to the touch panel of the first embodiment described above, each touch panel according to the second and third embodiments may include the first and/or second sensing electrodes formed in two layers or more which may be connected to each other in a parallel structure. Thus, the first and/or second sensing electrodes may be disposed in a parallel structure, so that the electric resistances of the first and/or second sensing electrodes may be reduced.

Therefore, the electric resistance of the touch panel according to the embodiment may be reduced so that the efficiency of the touch panel may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
a cover substrate;
a first sensing electrode including first unit sensing electrodes spaced apart from each other in a first direction on the cover substrate and first connecting electrodes to connect the first unit sensing electrodes to each other;
a second sensing electrode including second unit sensing electrodes spaced apart from each other in a second direction on the cover substrate;
a bridge electrode insulated from the first unit sensing electrodes to connect the second unit sensing electrodes to each other; and
an insulating layer on at least one of the first sensing electrode and the second sensing electrode;
wherein the bridge electrode includes connecting bridge electrodes to connect the second unit sensing electrodes to each other and second unit bridge electrodes overlapping with the second unit sensing electrodes;
wherein the first unit sensing electrode, the second unit sensing electrode, and the first connecting electrode are formed directly on one surface of the cover substrate;
wherein the bridge electrode is provided on at least a part of upper portions of the first connecting electrode, the first unit sensing electrode, and the second unit sensing electrode to make direct contact with the second unit sensing electrode;
wherein a through-hole is formed in the insulating layer; and
wherein the bridge electrode is disposed on the insulating layer and connects the second unit sensing electrodes to each other through the through-hole, and the bridge electrode entirely overlaps with at least one of the first sensing electrode and the second sensing electrode.

2. The touch panel of claim 1, wherein the first and second sensing electrodes are provided on a same surface of the cover substrate.

3. The touch panel of claim 1, wherein the bridge electrode further includes a first unit bridge electrode overlapping with the first unit sensing electrode.

4. The touch panel of claim 3, wherein the through-hole includes a first through-hole and a second through-hole,
the second unit sensing electrode is connected to the connecting bridge electrode or the second unit bridge electrode through the first through-hole; and
the first unit sensing electrode is connected to the first unit bridge electrode through the second through-hole.

5. The touch panel of claim 4, wherein the insulating layer is disposed on the connecting bridge electrode.

6. The touch panel of claim 4, wherein the insulating layer overlaps with the bridge electrode.

7. The touch panel of claim 4, wherein the first and second sensing electrodes and the bridge electrode include a same material.

8. The touch panel of claim 1, wherein the insulating layer is disposed on a front surface of the first and second sensing electrodes.

9. The touch panel of claim 1, wherein the insulating layer has a shape equal to a shape of the first or second sensing electrode.

10. The touch panel of claim 1, wherein the first and second sensing electrodes and the bridge electrode include a same material.

11. The touch panel of claim 10, wherein the first and second sensing electrodes and the bridge electrode include indium tin oxide (ITO).

12. The touch panel of claim 1, wherein the bridge electrode is directly formed on the cover substrate; and
at least a part of the first and second unit sensing electrodes and the first connecting electrode is disposed on the bridge electrode.

13. The touch panel of claim 1, further comprising a substrate on the cover substrate,
   wherein at least one of the first and second unit sensing electrodes, the first connecting electrode and the bridge electrode is directly formed on the substrate.

14. The touch panel of claim 13, wherein the first and second sensing electrodes and the bridge electrode include a same material.

* * * * *